(12) United States Patent
Kwon et al.

(10) Patent No.: US 11,367,634 B2
(45) Date of Patent: Jun. 21, 2022

(54) SUBSTRATE TREATING APPARATUS WITH EDGE TREATING UNIT AND SUBSTRATE TREATING METHOD

(71) Applicant: SEMES CO., LTD., Chungcheongnam-do (KR)

(72) Inventors: Ohyeol Kwon, Cheonan-si (KR); Jihyun Lee, Cheonan-si (KR); Young Ho Choo, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 392 days.

(21) Appl. No.: 16/557,790

(22) Filed: Aug. 30, 2019

(65) Prior Publication Data
US 2020/0075362 A1 Mar. 5, 2020

(30) Foreign Application Priority Data
Aug. 31, 2018 (KR) .................. 10-2018-0103894

(51) Int. Cl.
*H01L 21/67* (2006.01)
*H01L 21/687* (2006.01)
*H01L 21/68* (2006.01)

(52) U.S. Cl.
CPC .. *H01L 21/67115* (2013.01); *H01L 21/67051* (2013.01); *H01L 21/681* (2013.01); *H01L 21/68764* (2013.01)

(58) Field of Classification Search
CPC ......... H01L 21/67115; H01L 21/67051; H01L 21/681; H01L 21/68764; H01L 21/6708; H01L 21/02021; H01L 21/02041; H01L 21/6704; H01L 21/02052; H01L 21/02307; H01L 21/6715; H01L 21/67242; H01L 21/68
See application file for complete search history.

(56) References Cited

FOREIGN PATENT DOCUMENTS

| JP | 2017-117954 A | 6/2017 | |
|---|---|---|---|
| KR | 10-1265827 B | 5/2013 | |
| KR | 10-2014-0058335 A | 5/2014 | |
| KR | 10-1605698 B1 | 3/2016 | |
| KR | 101605698 B1 * | 3/2016 | ....... H01L 21/67288 |
| KR | 10-2016-0094496 A | 8/2016 | |
| KR | 10-2017-0113097 A | 10/2017 | |
| KR | 10-2017-0114935 A | 10/2017 | |
| KR | 10-2018-0029884 A | 3/2018 | |
| KR | 10-1842119 B | 3/2018 | |

* cited by examiner

*Primary Examiner* — John P. Dulka
(74) *Attorney, Agent, or Firm* — Li & Cai Intellectual Property (USA) Office

(57) ABSTRACT

The inventive concept relates to a substrate treating apparatus and method for removing various types of treating liquid or cleaning solution films on an edge region of a substrate without damage to a treated surface even though the substrate is rotated in an eccentric state.

22 Claims, 16 Drawing Sheets

SUBSTRATE TREATING APPARATUS WITH EDGE TREATING UNIT AND SUBSTRATE TREATING METHOD

CROSS-REFERENCE TO RELATED APPLICATIONS

A claim for priority under 35 U.S.C. § 119 is made to Korean Patent Application No. 10-2018-0103894 filed on Aug. 31, 2018, in the Korean Intellectual Property Office, the entire contents of which are hereby incorporated by reference.

BACKGROUND

Embodiments of the inventive concept described herein relate to a substrate treating apparatus and method, and more particularly, relate to a substrate treating apparatus and method for performing light treatment on an edge region of a substrate that is placed on a support plate and that rotates.

Various processes, such as deposition, photolithography, etching, cleaning, and the like, are performed to manufacture semiconductor devices.

In general, an edge region of a substrate is not used to manufacture semiconductor devices. When the substrate is transferred between apparatuses, a film formed on the edge region of the substrate may be brought into contact with a transfer robot and may act as particles. Therefore, a process of removing the film from the edge region of the substrate is performed.

FIG. 1 is a schematic view illustrating an example of a liquid treating apparatus for removing a film formed on an edge region of a substrate. Referring to FIG. 1, a liquid treating apparatus 1 dispenses a treating liquid 3 for removing a film onto an edge region of a rotating substrate 2.

When the substrate 2 is not placed in a correct position, the edge region of the substrate 2 may not be treated to a uniform width. Therefore, when the substrate 2 is placed on a support plate 5, the substrate 2 is aligned in the correct position on the support plate 5 by alignment members 4.

The alignment members 4 around the substrate 2 push the substrate 2 in various directions to move the substrate 2 to the correct position. Due to the plurality of alignment members 4, the structure of the apparatus is complex.

After the substrate 2 is aligned, vacuum pressure is applied to clamp the substrate 2 to the support plate 5. However, the substrate 2 may be offset from the correct position when the vacuum pressure is applied thereto.

Furthermore, a rotary shaft of the support plate 5 may be distorted after the apparatus is used for a long period of time. In this case, the edge region of the substrate 2 may not be treated to a uniform width even though the substrate 2 is placed in the correct position on the support plate 5.

SUMMARY

Embodiments of the inventive concept provide a substrate treating apparatus and method for treating an edge region of a rotating substrate to the same width from a distal end of the substrate.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a rotatable support plate that supports the substrate, a photographing member that obtains an image by photographing the rotating substrate, an edge treating unit that treats an edge region of the substrate, a drive member that moves the support plate or the edge treating unit to change a relative position between the support plate and the edge treating unit, and a controller that controls the drive member. The controller controls the drive member such that the relative position is changed depending on a rotation angle of the substrate, based on the image obtained through the photographing member.

The edge treating unit may be a light irradiating member that irradiates light.

The light irradiating member may include a laser that irradiates a laser beam.

The controller may control the drive member such that, depending on the rotation angle of the substrate placed on the support plate, a light irradiation point is changed along a straight line that connects the center of the substrate placed in a correct position on the support plate when viewed from above and a point where the light is irradiated to the substrate placed in the correct position.

The controller may control the drive member such that a region where the light is irradiated to the substrate is the same with respect to a distal end of the substrate when the substrate placed on the support plate is rotated.

The photographing member may photograph the edge region of the substrate. The photographing member may photograph the edge region of the substrate a plurality of times to obtain a plurality of images while the support plate is rotated through one revolution. The controller may calculate, on the straight line, a distance from the center of the substrate placed in the correct position on the support plate to a distal end of the substrate placed on the support plate, at each rotation angle during the rotation of the support plate by using the plurality of images.

The controller may calculate an eccentric distance and an eccentric direction of the substrate placed on the support plate from the center of the substrate placed in a correct position, based on the image obtained through the photographing member and may control the drive member such that a region where the light is irradiated to the substrate is the same with respect to a distal end of the substrate, depending on the rotation angle of the substrate from the eccentric distance and direction calculated.

The rotation angle of the support plate and photographing time of the photographing member may be synchronized with each other.

The controller may generate a dynamic profile using positions to which the light irradiating member moves according to the rotation of the substrate and may control the drive member according to the dynamic profile.

The support plate may be rotated by a first motor, and the drive member may include a second motor that moves the light irradiating member.

The controller may perform synchronization control on the first motor and the second motor such that the light irradiating member is moved according to the dynamic profile depending on a rotation angle of the support plate.

The apparatus may further include a nozzle unit that dispenses a treating liquid onto a region where the light is irradiated to the substrate placed on the support plate.

The controller may control the nozzle unit and the light irradiating member such that the light irradiating member irradiates the light to the treating liquid after the nozzle unit dispenses the treating liquid onto the support plate.

The support plate may be rotated by a first motor, and the controller may change a dispensing position of the treating liquid such that the dispensing position of the treating liquid dispensed from the nozzle unit is the same from a distal end of the substrate, depending on the rotation angle of the support plate.

The treating liquid may be dispensed onto the edge region of the substrate, and the apparatus may further include a spread prevention means that prevents the treating liquid dispensed onto the edge region from flowing toward a central region of the substrate.

According to an exemplary embodiment, a method for treating a substrate includes treating the substrate by irradiating light from an edge treating unit, or dispensing a treating liquid from a nozzle unit, to an edge region of the substrate placed on a rotating support plate, and the edge treating unit irradiates the light to the substrate while being moved, based on a position where the substrate is offset from a correct position on the support plate, when the substrate is placed on the support plate in a state of being offset from the correct position on the support plate.

The edge treating unit may include a light irradiating member that irradiates the light, and the light irradiating member may move such that a region where the light is irradiated to the substrate is the same with respect to a distal end of the substrate.

The light irradiating member may be moved such that, depending on a rotation angle of the substrate placed on the support, a light irradiation point is changed along a straight line that connects the center of the substrate placed in the correct position on the support plate when viewed from above and a point where the light is irradiated to the substrate placed in the correct position.

A photographing member may obtain a plurality of images by photographing the edge region of the substrate a plurality of times while the substrate is rotated through one revolution during rotation of the support plate after the substrate is placed on the support plate, an eccentric distance and an eccentric direction of the substrate placed on the support plate may be calculated based on the plurality of images, and the light irradiating member may be moved based on the eccentric distance and the eccentric direction.

A dynamic profile of the light irradiating member may be generated based on the eccentric distance and the eccentric direction, and the light irradiating member may be moved based on the dynamic profile.

The light may be a laser beam.

A treating liquid may be dispensed onto the substrate before or while the light is irradiated, and the light may heat the treating liquid dispensed onto the substrate.

The treating liquid may include phosphoric acid.

The light may directly remove a film on the substrate.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
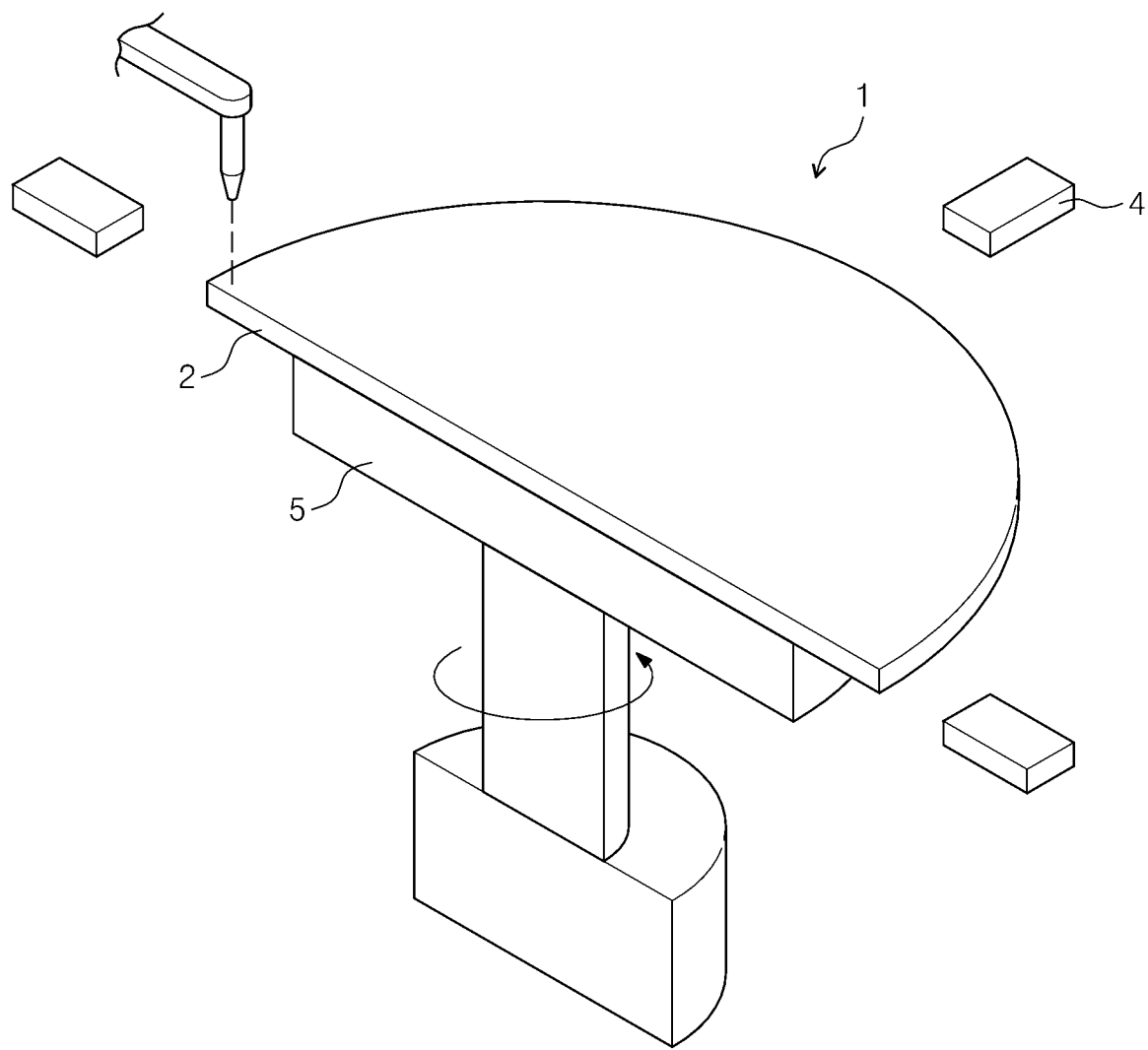
FIG. 1 is a schematic view illustrating an apparatus for treating an edge region of a substrate in the related art.

Various modifications and variations can be made to embodiments of the inventive concept, and the scope of the inventive concept should not be constructed as limited to the embodiments set forth herein. These embodiments are provided so that this disclosure will be thorough and complete, and will fully convey the scope of the inventive concept to those skilled in the art. Accordingly, in the drawings, the shapes of components are exaggerated for clarity of illustration.

An apparatus for removing a film on an edge region of a substrate in a cleaning process will be described in an embodiment of the inventive concept. However, without being limited thereto, the inventive concept is applicable to various types of apparatuses for dispensing a liquid onto a substrate.

Hereinafter, apparatuses and methods of the inventive concept will be described in detail with reference to the accompanying drawings.

Figure 2:
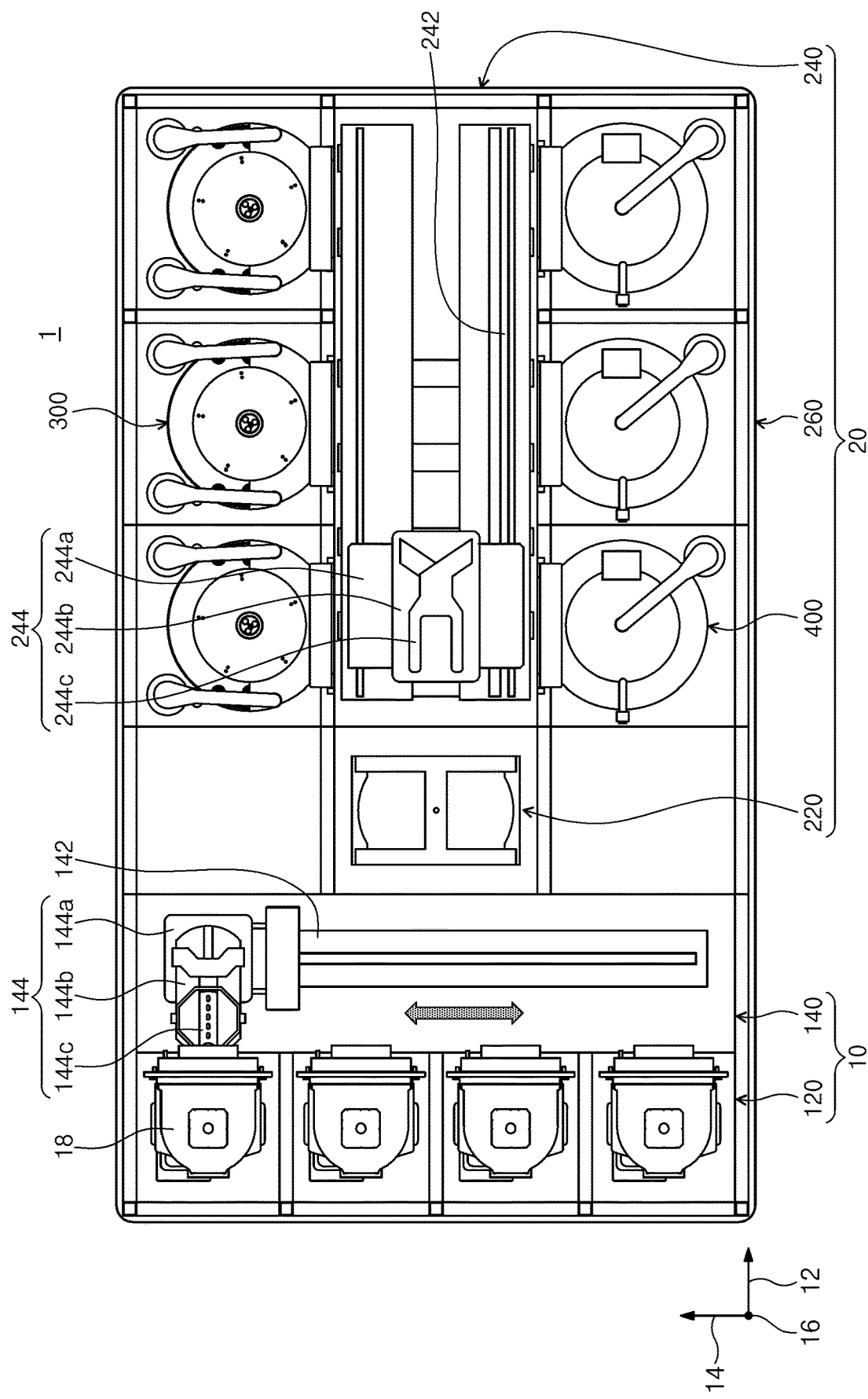
FIG. 2 is a plan view illustrating a substrate treating apparatus according to an embodiment of the inventive concept.

FIG. 2 is a schematic plan view illustrating a substrate treating apparatus 1 of the inventive concept. Referring to FIG. 2, the substrate treating apparatus 1 has an index module 10 and a process module 20. The index module 10 has a load port 120 and a transfer frame 140. The load port 120, the transfer frame 140, and the process module 20 are sequentially arranged in a row.

Hereinafter, the direction in which the load port 120, the transfer frame 140, and the process module 20 are arranged is referred to as a first direction 12. Furthermore, a direction perpendicular to the first direction 12 when viewed from above is referred to as a second direction 14, and a direction perpendicular to the plane including the first direction 12 and the second direction 14 is referred to as a third direction 16.

A carrier 18 having substrates W received therein is placed on the load port 120. A plurality of load ports 120 may be provided. The load ports 120 may be arranged in a row along the second direction 14. FIG. 1 illustrates an example that the index module 10 includes four load ports 120. However, the number of load ports 120 may be increased or decreased depending on conditions such as the process efficiency and the footprint of the process module 20.

The carrier 18 has slots (not illustrated) that are formed therein to support the edges of the substrates W. The plurality of slots are arranged in the third direction 16, and the substrates W are stacked one above another with a spacing gap therebetween in the carrier 18 along the third direction 16. A Front Opening Unified Pod (FOUP) may be used as the carrier 18.

The process module 20 has a buffer unit 220, a transfer chamber 240, and process chambers 260. The transfer chamber 240 is arranged such that the lengthwise direction thereof is parallel to the first direction 12. The process chambers 260 are disposed on one side and an opposite side of the transfer chamber 240 along the second direction 14. The process chambers 260 on the one side of the transfer chamber 240 and the process chambers 260 on the opposite side of the transfer chamber 240 are located in a symmetric arrangement with respect to the transfer chamber 240.

Some of the process chambers 260 are arranged along the lengthwise direction of the transfer chamber 240. Furthermore, other process chambers 260 are stacked one above another. That is, the process chambers 260 may be arranged in an A×B array (A and B being natural numbers of 1 or larger) on the one side of the transfer chamber 240. Here, "A" is the number of process chambers 260 arranged in a row along the first direction 12, and "B" is the number of process chambers 260 arranged in a column along the third direction 16.

In the case where four or six process chambers 260 are disposed on the one side of the transfer chamber 240, the process chambers 260 may be arranged in a 2×2 or 3×2 array. The number of process chambers 260 may be increased or decreased. Alternatively, the process chambers 260 may be provided on only the one side of the transfer chamber 240. In another case, the process chambers 260 may be provided in a single layer on the one side and the opposite side of the transfer chamber 240.

The buffer unit 220 is disposed between the transfer frame 140 and the transfer chamber 240. The buffer unit 220 provides a space in which the substrates W stay before transferred between the transfer chamber 240 and the transfer frame 140. The buffer unit 220 has slots (not illustrated) therein, on which the substrates W are placed. The slots (not illustrated) are spaced apart from each other along the third direction 16. The buffer unit 220 is open at one side facing the transfer frame 140 and at an opposite side facing the transfer chamber 240.

The transfer frame 140 transfers the substrates W between the carriers 18 placed on the load ports 120 and the buffer unit 220. An index rail 142 and an index robot 144 are provided in the transfer frame 140.

The index rail 142 is arranged such that the lengthwise direction thereof is parallel to the second direction 14. The index robot 144 is installed on the index rail 142 and rectilinearly moves along the index rail 142 in the second direction 14.

The index robot 144 has a base 144a, a body 144b, and an index arm 144c. The base 144a is installed so as to be movable along the index rail 142. The body 144b is combined with the base 144a. The body 144b is movable on the base 144a along the third direction 16.

Furthermore, the body 144b is rotatable on the base 144a. The index arm 144c is combined with the body 144b and is movable forward and backward relative to the body 144b. A plurality of index arms 144c may be provided. The index arms 144c may individually operate. The index arms 144c may be stacked one above another with a spacing gap therebetween along the third direction 16.

Some of the index arms 144c may be used to transfer the substrates W from the process module 20 to the carriers 18, and the other index arms 144c may be used to transfer the substrates W from the carriers 18 to the process module 20.

Accordingly, particles generated from the substrates W to be treated may be prevented from adhering to the treated substrates W in the process in which the index robot 144 transfers the substrates W between the carriers 18 and the process module 20.

The transfer chamber 240 transfers the substrates W between the buffer unit 220 and the process chambers 260 and between the process chambers 260. A guide rail 242 and a main robot 244 are provided in the transfer chamber 240. The guide rail 242 is arranged such that the lengthwise direction thereof is parallel to the first direction 12. The main robot 244 is installed on the guide rail 242 and rectilinearly moves on the guide rail 242 along the first direction 12.

The main robot 244 has a base 244a, a body 244b, and a main arm 244c. The base 244a is installed so as to be movable along the guide rail 242. The body 244b is combined with the base 244a. The body 244b is movable on the base 244a along the third direction 16. Furthermore, the body 244b is rotatable on the base 244a.

The main arm 244c is combined with the body 244b and is movable forward and backward relative to the body 244b. A plurality of main arms 244c may be provided. The main arms 244c may individually operate. The main arms 244c are stacked one above another with a spacing gap therebetween along the third direction 16. The main arms 244c used to transfer the substrates W from the buffer unit 220 to the process chambers 260 may differ from the main arms 244c used to transfer the substrates W from the process chambers 260 to the buffer unit 220.

The process chambers 260 include a plurality of liquid treating chambers 300, each of which performs a cleaning process on a substrate W, and edge treating chambers 400, each of which removes a film with which an edge region of the substrate W is coated. Three liquid treating chambers 300 and three edge treating chambers 400 face each other with respect to the transfer chamber 240 and are arranged along the first direction 12.

Figure 3:
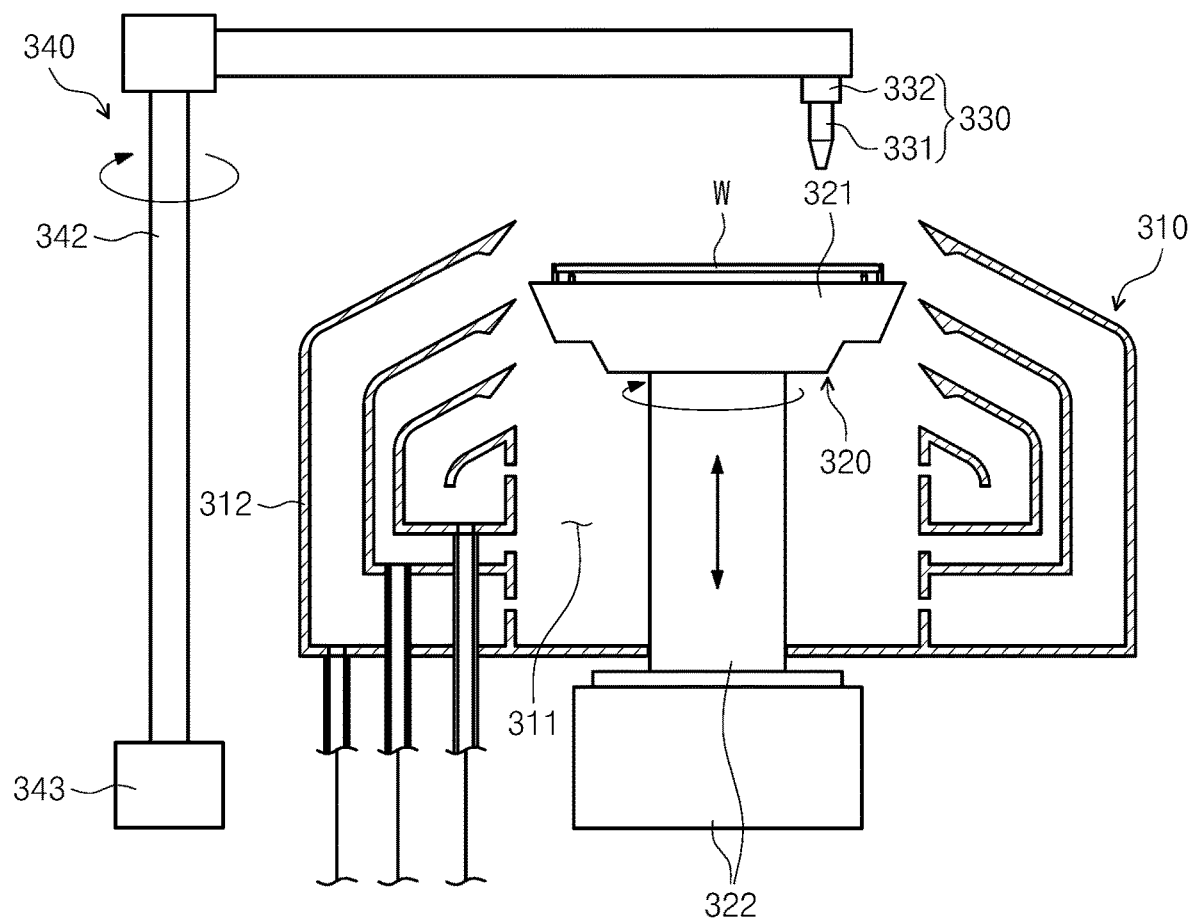
FIG. 3 is a sectional view illustrating a liquid treating chamber of FIG. 2.

Referring to FIG. 3, each of the liquid treating chambers 300 includes a cup 310, a support unit 320, a nozzle unit 330, and a nozzle actuator 340. The cup 310 has a processing space 311 in which various types of treating liquids C for respective processes are dispensed onto a substrate W. The cup 310 includes a plurality of recovery bowls 312 that recover the treating liquids C dispensed onto the substrate W. The plurality of recovery bowls 312 are implemented in box shapes that have different heights and different base areas. The recovery bowls 312 are concentric with one another. Open upper parts are formed to be inclined toward the center of the cup 310 such that the treating liquids C scattered from the substrate W are introduced into only the specific recovery bowls 312, respectively.

The support unit 320 supports and rotates the substrate W. The support unit 320 includes a support plate 321 and a drive member 322. Pin members for supporting the substrate W are coupled to an upper surface of the support plate 321. The pin members support the backside of the substrate W. Chuck pins of the pin members support the side of the substrate W.

The support plate 321 may be rotated by the drive member 322. The drive member 322 is coupled to a bottom surface of the support plate 321. The drive member 322 includes a drive shaft and an actuator. The drive shaft is coupled to the bottom surface of the support plate 321.

The nozzle unit 330 dispenses the treating liquids C onto the substrate W. The nozzle unit 330 includes a nozzle 331 and a support 332. The nozzle 331 dispenses the treating liquids C onto the substrate W. The nozzle 331 is supported by the support 332.

The nozzle actuator 340 moves the support 332. The nozzle actuator 340 includes a support shaft 342 and a motor (not illustrated). The support shaft 342 is combined with the support 332. The support shaft 342 is moved by the motor.

According to an embodiment, a guide rail 343 may be provided, and the support shaft 342 may be rectilinearly moved along the guide rail 343. According to another embodiment, the support shaft 342 may be rotated about the central axis thereof.

Figure 4:
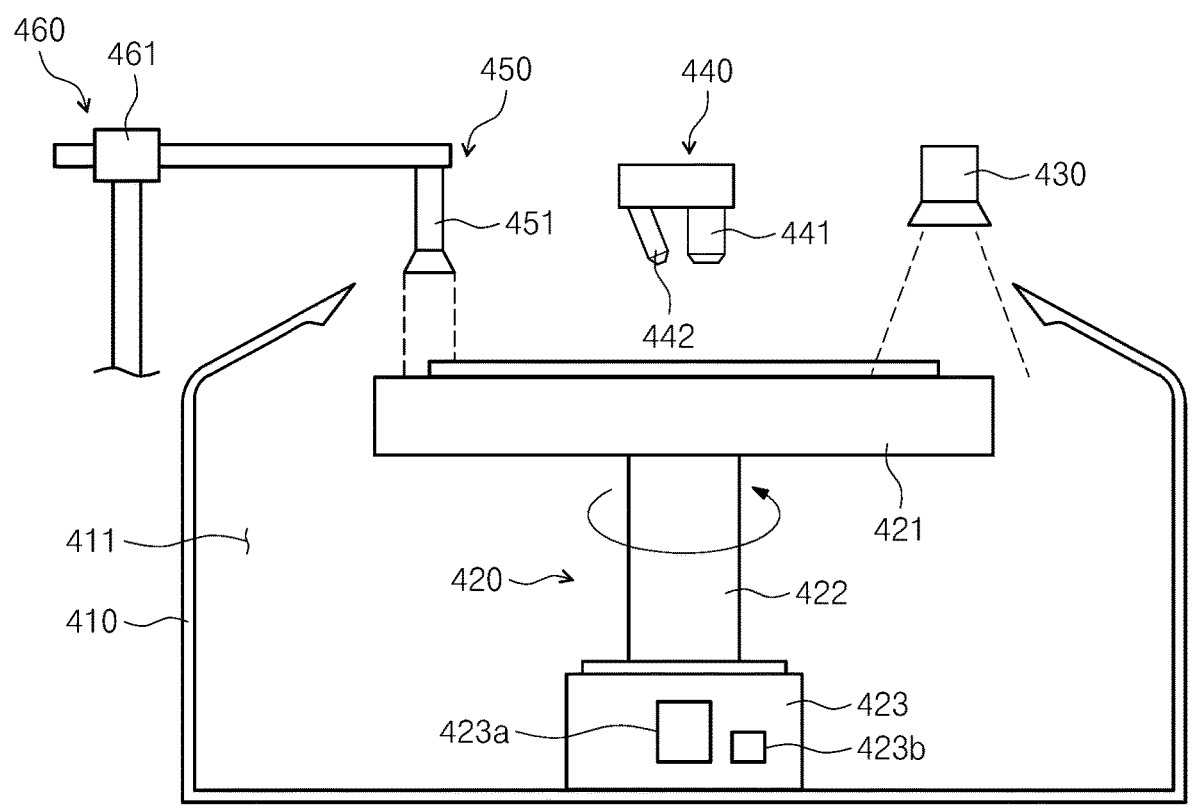
FIG. 4 is a sectional view illustrating an edge treating chamber of FIG. 2.
Figure 5:
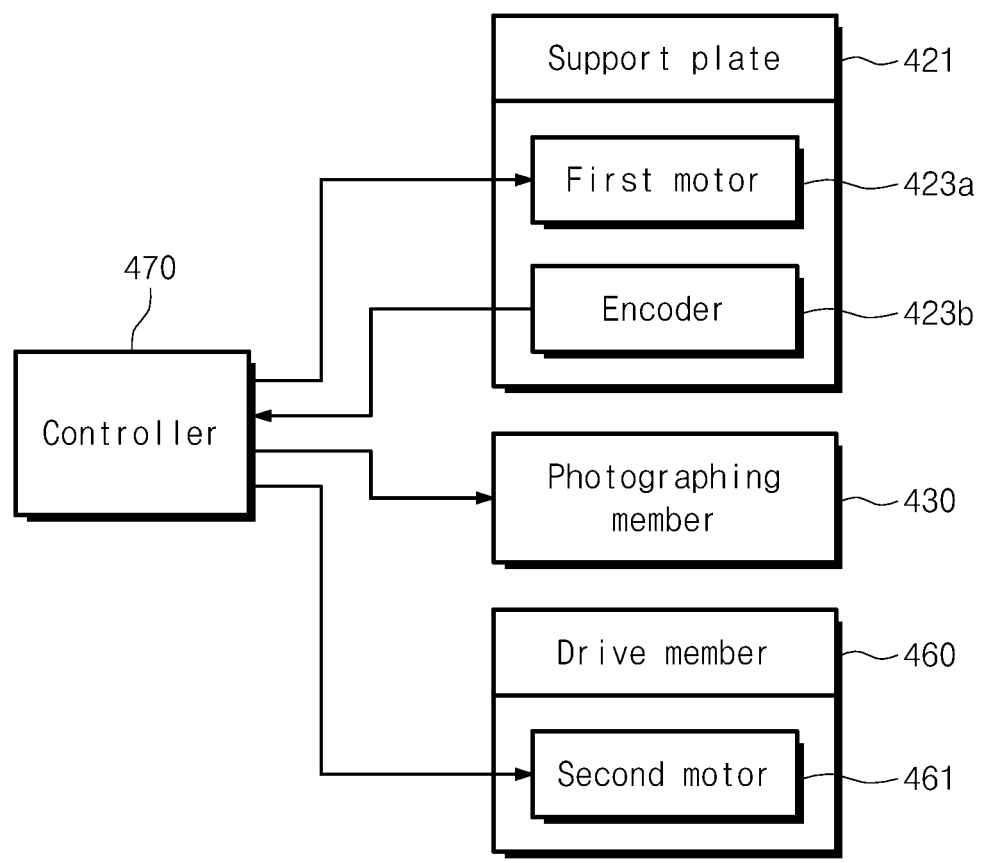
FIG. 5 is a block diagram illustrating a signal transmission state between components of the edge treating chamber of FIG. 4.

Hereinafter, the edge treating chamber 400 that removes a film formed on an edge region of a substrate W will be described. FIG. 4 illustrates the edge treating chamber 400 of FIG. 2. FIG. 5 is a block diagram illustrating a signal transmission state between components of the edge treating chamber of FIG. 4.

Referring to FIGS. 4 and 5, the edge treating chamber 400 includes a cup 410, a support unit 420, a photographing member 430, a nozzle unit 440, an edge treating unit 450, a drive member 460, and a controller 470.

The cup 410 has a processing space 411 in which the substrate W is treated. The support unit 420 supports the substrate W in the processing space 411. The support unit 420 has a support plate 421, a rotary shaft 422, and an actuator 423. The support plate 421 supports the substrate W. The support plate 421 may have a larger diameter than the substrate W. The support plate 421 may include lift pins (not illustrated) for receiving the substrate W from the main robot 244 and transferring the substrate W to the main robot 244.

Alternatively, the support plate 421 may have a smaller diameter than the substrate W and may directly exchange the substrate W with the main robot 244 without the lift pins.

A vacuum line (not illustrated) may be provided in the support plate 421 to clamp the substrate W to the support plate 421 by vacuum pressure.

The rotary shaft 422 supports the support plate 421 and functions as a central axis of rotation of the support plate 421. The actuator 423 is combined with the rotary shaft 422 and rotates the rotary shaft 422 about the central axis thereof. The actuator 423 has a first motor 423a and an encoder 423b. The first motor 423a functions as a drive source that rotates the rotary shaft 422. The encoder 423b detects information regarding the rotation angle of the first motor 423a.

The photographing member 430 is provided above the support plate 421. According to an embodiment, the photographing member 430 may be implemented with a camera. The photographing member 430 takes an image of the substrate W. According to an embodiment, the photographing member 430 takes an image of only a partial region including the distal end of the edge region of the substrate W. At this time, the substrate W is rotated, and the photographing member 430 obtains a plurality of images by photographing the substrate W a plurality of times while the substrate W is rotated.

The photographing time of the photographing member 430 may be synchronized with the rotation of the first motor 423a. For example, while the support plate 421 is rotated through one revolution, the photographing member 430 may take an image of the substrate W every time the support plate 421 is rotated through a predetermined angle.

Alternatively, the photographing member 430 may obtain an image of the entire substrate W by photographing the entire upper surface of the support plate 421 once.

The nozzle unit 440 includes a liquid dispensing nozzle 441 and a gas dispensing nozzle 442. The liquid dispensing nozzle 441 dispenses a treating liquid onto the edge region of the substrate W. The gas dispensing nozzle 442 dispenses a gas onto the edge region of the substrate W. The point where the gas is dispensed onto the substrate W is closer to the center of the substrate W than the point where the treating liquid is dispensed onto the substrate W. According to an embodiment, the point where the gas is dispensed onto the substrate W and the point where the treating liquid is dispensed onto the substrate W may be arranged in the radial direction of the substrate W. The liquid dispensing nozzle 441 or the gas dispensing nozzle 442 may dispense the treating liquid or the gas in a downwardly inclined direction away from the center of the substrate W. The gas prevents the treating liquid dispensed onto the edge region of the substrate W from flowing toward a central region of the substrate W.

The treating liquid may be a liquid that removes the film formed on the substrate W. For example, the treating liquid may be phosphoric acid ($H_3PO_4$). Furthermore, the film may be a silicon nitride film.

According to an embodiment, while dispensing the treating liquid, the liquid dispensing nozzle 441 is moved a set distance depending on the rotation angle of the substrate W placed on the support plate 421. The liquid dispensing nozzle 441 is moved such that the dispensing point of the treating liquid is changed along a straight line that connects the center of the substrate W the point where the treating liquid is dispensed onto the substrate W placed in the correct position. As the substrate W is rotated, the liquid dispensing nozzle 441 is moved to dispense the treating liquid onto the substrate W to the same width from the distal end of the substrate W.

According to an embodiment, the liquid dispensing nozzle 441 and the gas dispensing nozzle 442 may be mounted on the same arm and may be moved together by a movement of the arm.

The edge treating unit 450 treats the edge region of the substrate W. According to an embodiment, the edge treating unit 450 includes a light irradiating member 451 that irradiates light to the edge region of the substrate W.

For example, the light may be a laser beam, and the light irradiating member 451 may be a laser that irradiates the laser beam. The laser beam may perform a function of heating the treating liquid dispensed onto the substrate W. For example, the laser beam may have a wavelength appropriate for heating the treating liquid.

The drive member 460 moves the light irradiating member 451 to change the relative position between the substrate W and the light irradiating member 451. According to an embodiment, the drive member 460 moves the light irradiating member 451 depending on the rotation angle of the substrate W placed on the support plate 421. The light irradiating member 451 is moved such that the light irradiation point is changed along a straight line that connects the center of the substrate W placed in the correct position on the support plate 421 when viewed from above and the point where the light is irradiated to the substrate W placed in the correct position. As the substrate W is rotated, the light irradiating member 451 is moved to irradiate light to the substrate W to the same width from the distal end of the substrate W.

The drive member 460 includes a second motor 461. Alternatively, during the process, the light irradiating member 451 may be fixed in position, and the drive member 460 may move the support plate 421.

The controller 470 calculates travel distances of the light irradiating member 451 for respective rotation angles of the substrate W from a plurality of images obtained through the photographing member 430 and controls the drive member 460 to move the light irradiating member 451 according to the calculated values. Furthermore, the controller 470 may control the liquid dispensing nozzle 441 to move the liquid dispensing nozzle 441 according to the calculated values. As described above, the controller 470 controls the drive member 460 and the liquid dispensing nozzle 441 to allow the light irradiation region or the treating liquid dispensing region to maintain the same width from the distal end of the substrate W when the substrate W is rotated.

According to an embodiment, the controller 470 calculates values by which the light irradiating member 451 has to be moved for respective rotation angles of the support plate 421 and performs synchronization control on the first motor 423a rotating the support plate 421 and the second motor 461 moving the light irradiating member 451.

Hereinafter, a method in which the controller 470 calculates travel distances of the light irradiating member 451 for respective rotation angles of the substrate W from a plurality of images obtained through the photographing member 430 will be described.

According to an embodiment, the controller 470 detects the positions of the distal end of the substrate W at specific points of images taken by the photographing member 430. When the substrate W is placed in the correct position on the support plate 421, the positions of the distal end of the substrate W in the plurality of images are all the same. However, when the substrate W is eccentrically located off the center of the support plate 421, the positions of the distal end of the substrate W in the plurality of images are all different from one another.

In this case, because the photographing time of the plurality of images is synchronized with the rotation angle of the first motor 423a, the controller 470 may identify the difference between the rotation angles of the substrate W at the time points when the images are taken and may calculate the eccentric distance and the eccentric direction of the substrate W, based on a change in the positions of the distal end of the substrate W for the respective rotation angles. When the eccentric distance and the eccentric direction are calculated, the position of the distal end of the substrate W according to the rotation angle of the substrate W may be identified at the point where light is irradiated from the light irradiating member 451.

Alternatively, while the substrate W is rotated, the photographing member 430 may continually photograph the position of the point where light is irradiated from the light irradiating member 451, and the light irradiating member 451 may be moved, based on the positions of the distal end of the substrate W for respective rotation angles of the substrate W that are obtained from the images taken.

In another case, while the substrate W is rotated, the photographing member 430 may continually photograph the position of a point on the opposite side to the light irradiation point of the light irradiating member 451 with respect to the center of the substrate W, and the light irradiating member 451 may be moved in the opposite direction, based on the positions of the distal end of the substrate W for respective rotation angles of the substrate W that are obtained from the images taken.

According to an embodiment, the controller 470 may generate a dynamic profile using travel distances of the light irradiating member 451 for respective rotation angles of the substrate W and may move the light irradiating member 451 or the liquid dispensing nozzle 441 based on the dynamic profile. The dynamic profile may be provided in the form of a table or a graph.

Figure 6:
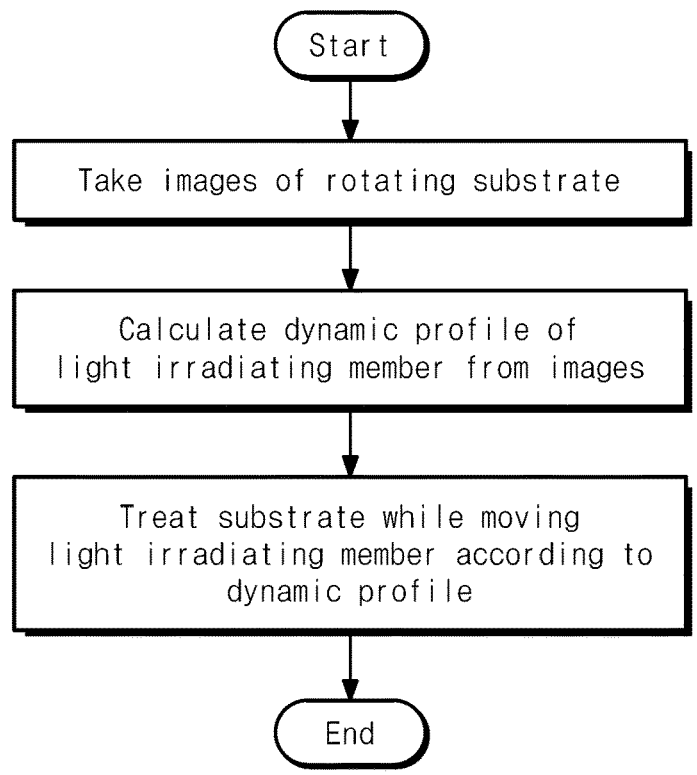
FIGS. 6 and 7 are flowcharts illustrating substrate treating methods according to embodiments of the inventive concept.
Figure 7:
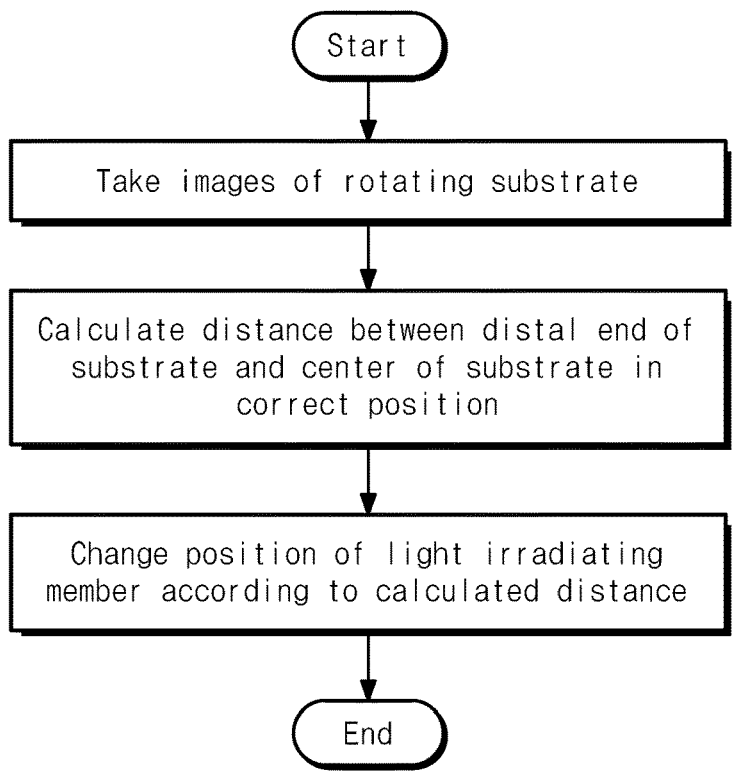
Figure 8:
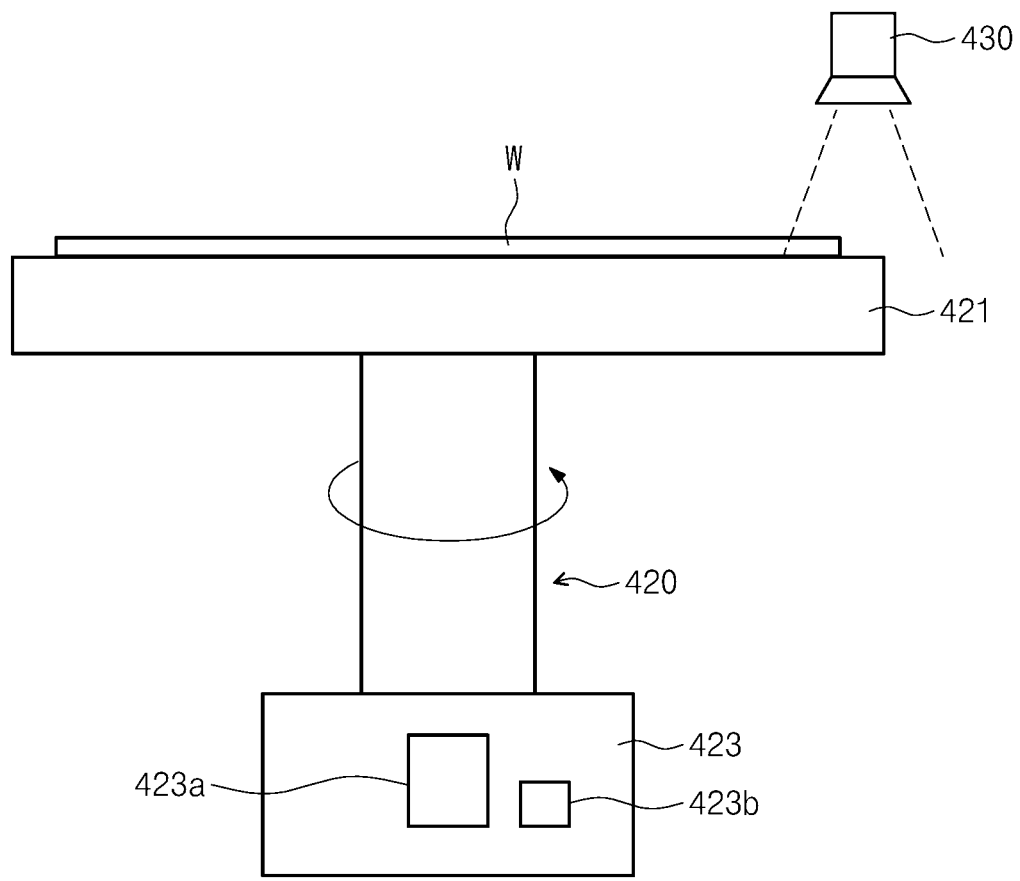
FIG. 8 is a schematic view illustrating a state in which a substrate is treated in the edge treating chamber of FIG. 4.

FIGS. 6 and 7 are flowcharts illustrating substrate treating methods according to embodiments of the inventive concept, and FIGS. 8 to 13 are views illustrating a process of treating a substrate according to FIGS. 6 and 7. First, as illustrated in FIG. 8, the photographing member 430 takes an image of a rotating substrate W when the substrate W is placed on the support plate 421. The photographing member 430 takes a plurality of images of an edge region of the substrate W depending on rotation angles of the substrate W.

The controller 470 generates a dynamic profile for movements of the liquid dispensing nozzle 441 and the light irradiating member 451 from the obtained images.

Figure 9:
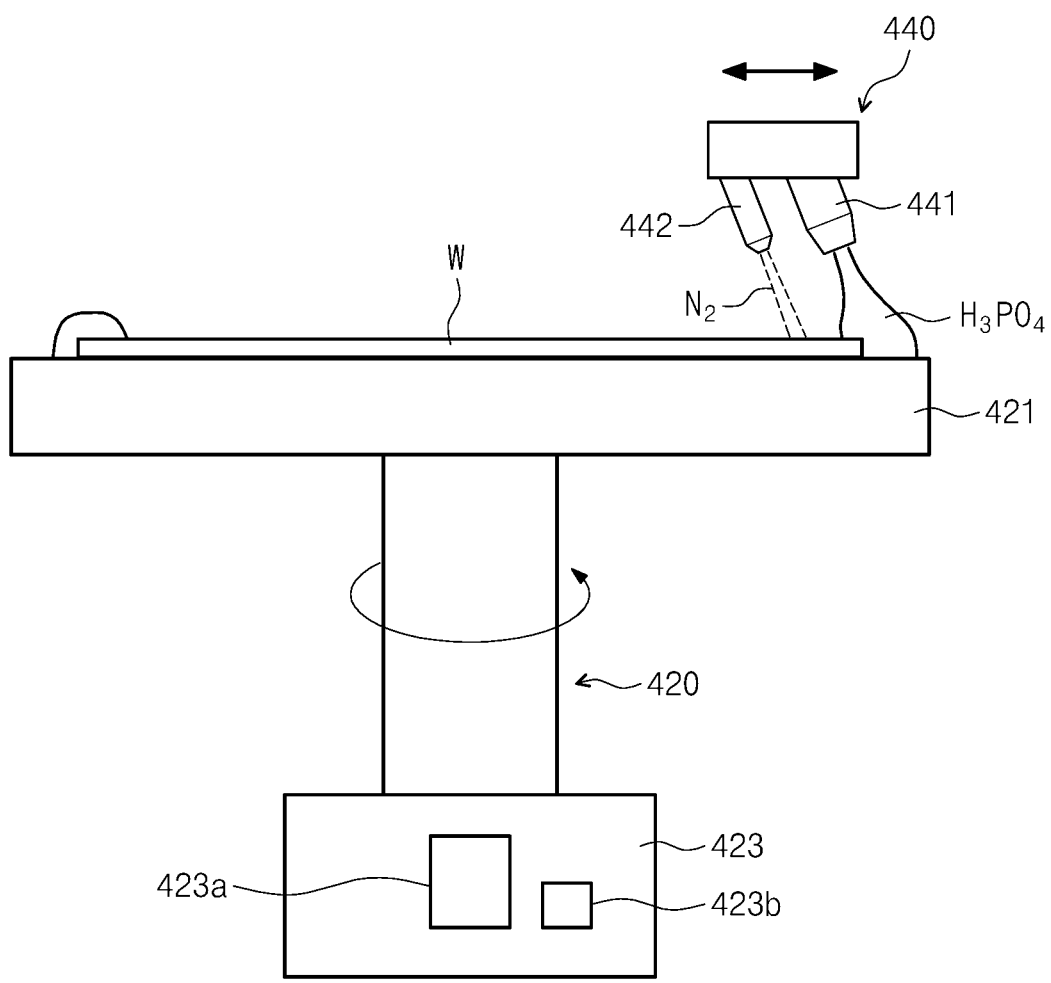
FIG. 9 is a view illustrating a state in which a photographing member takes an image of an edge region of the substrate.

Next, as illustrated in FIG. 9, the liquid dispensing nozzle 441 dispenses a treating liquid onto the edge region of the substrate W while moving according to the dynamic profile as the substrate W is rotated. While the treating liquid is dispensed, the gas dispensing nozzle 442 dispenses a gas to prevent the treating liquid from flowing toward a central region of the substrate W. The gas dispensing nozzle 442, together with the liquid dispensing nozzle 441, moves the same distance in the same direction.

Because the liquid dispensing nozzle 441 dispenses the treating liquid while moving according to the dynamic profile, the width by which the treating liquid is dispensed onto the entire edge region of the substrate W is the same from the distal end of the substrate W even though the substrate W is eccentrically located off the center of the support plate 421.

Then, as illustrated in FIGS. 10 to 13, light is irradiated from the light irradiating member 451 to the treating liquid dispensed onto the substrate W, depending on rotation angles of the substrate W. The light irradiating member 451 is moved according to the dynamic profile.

Figure 10:
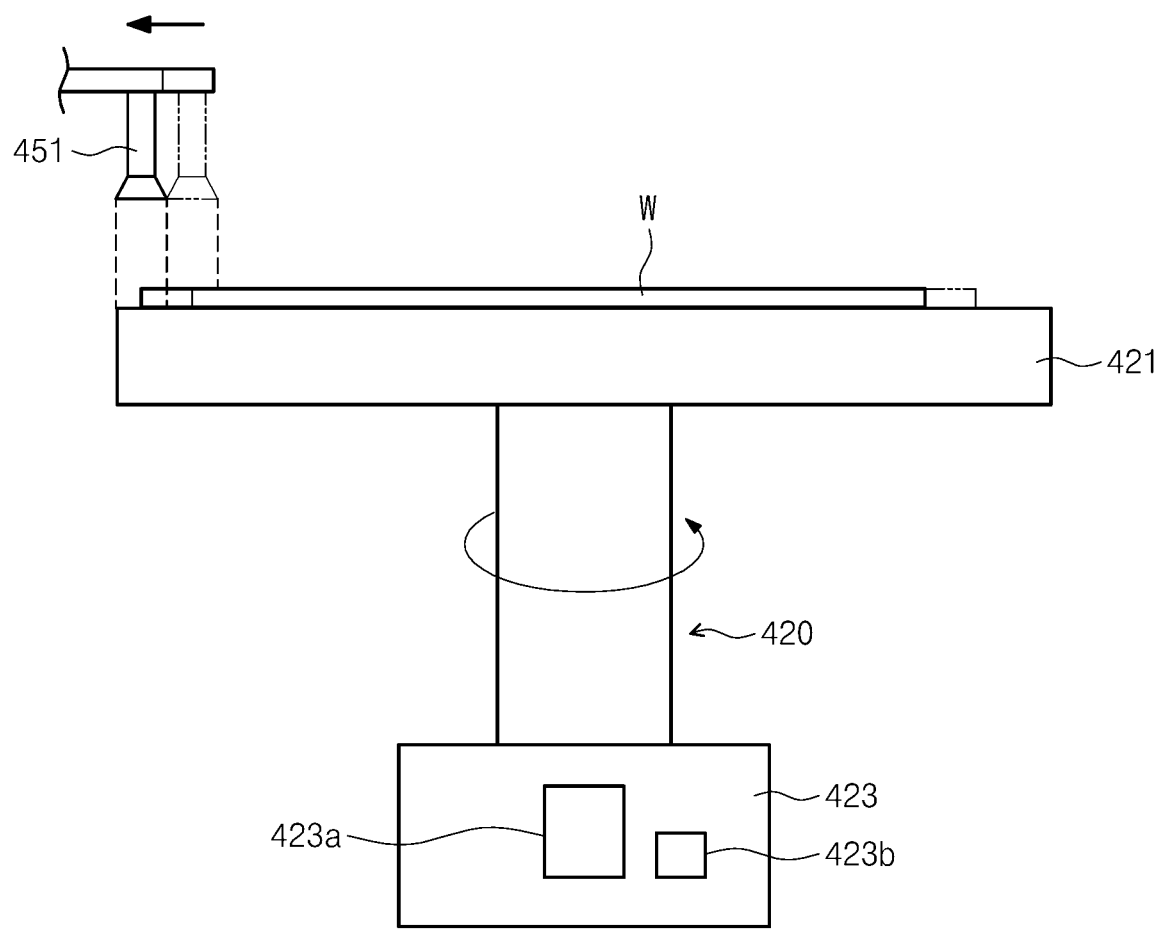
FIGS. 10 to 13 are sectional views and plan views illustrating a state in which a light irradiating member treats the edge region of the substrate while being moved.
Figure 11:
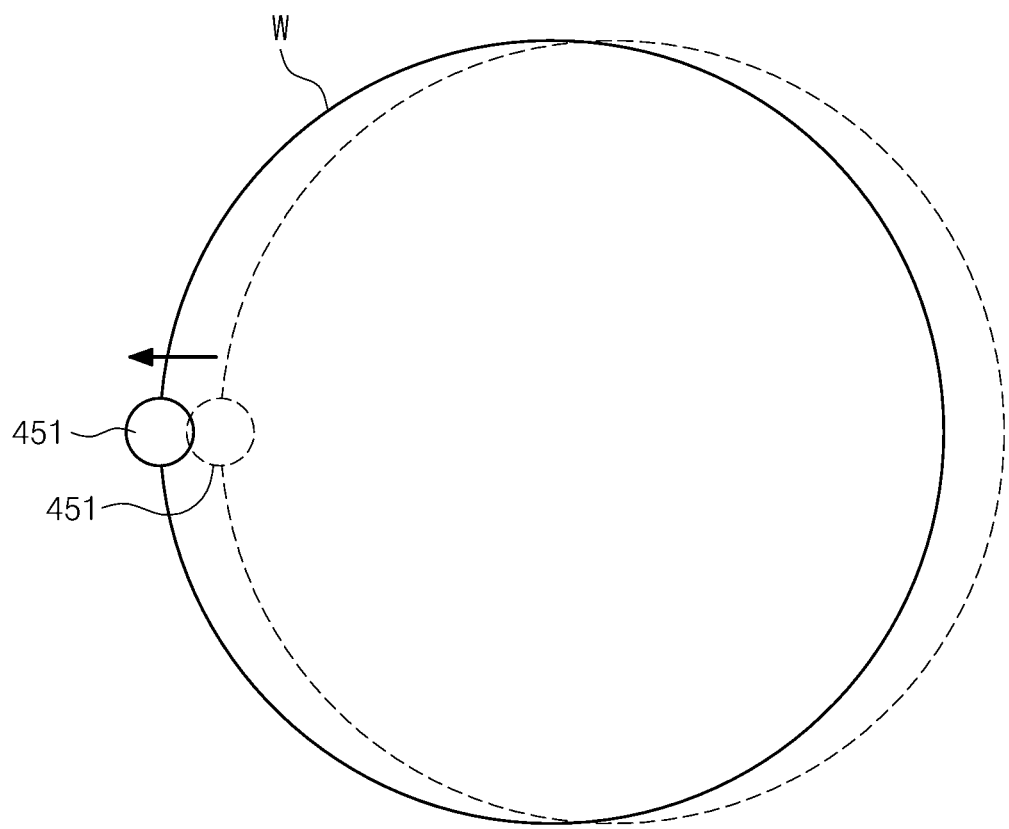
Figure 12:
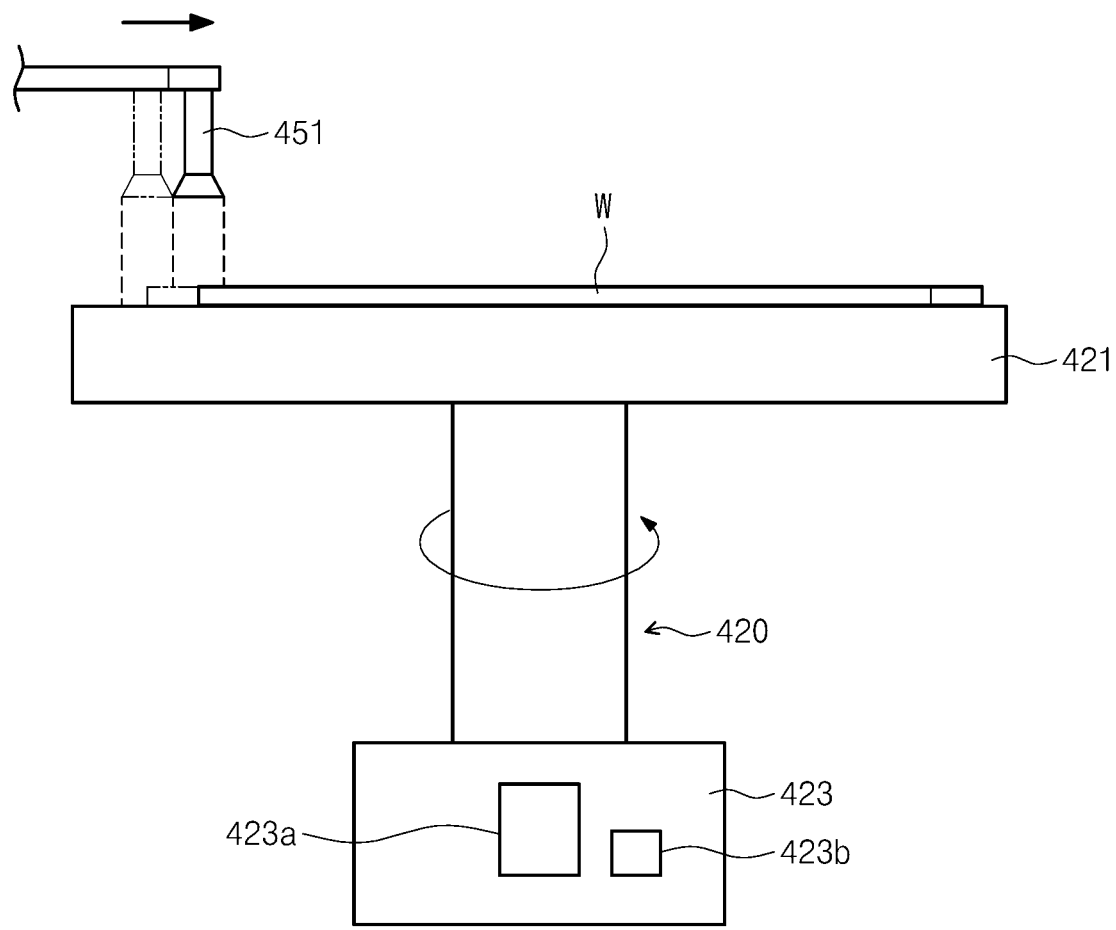
Figure 13:
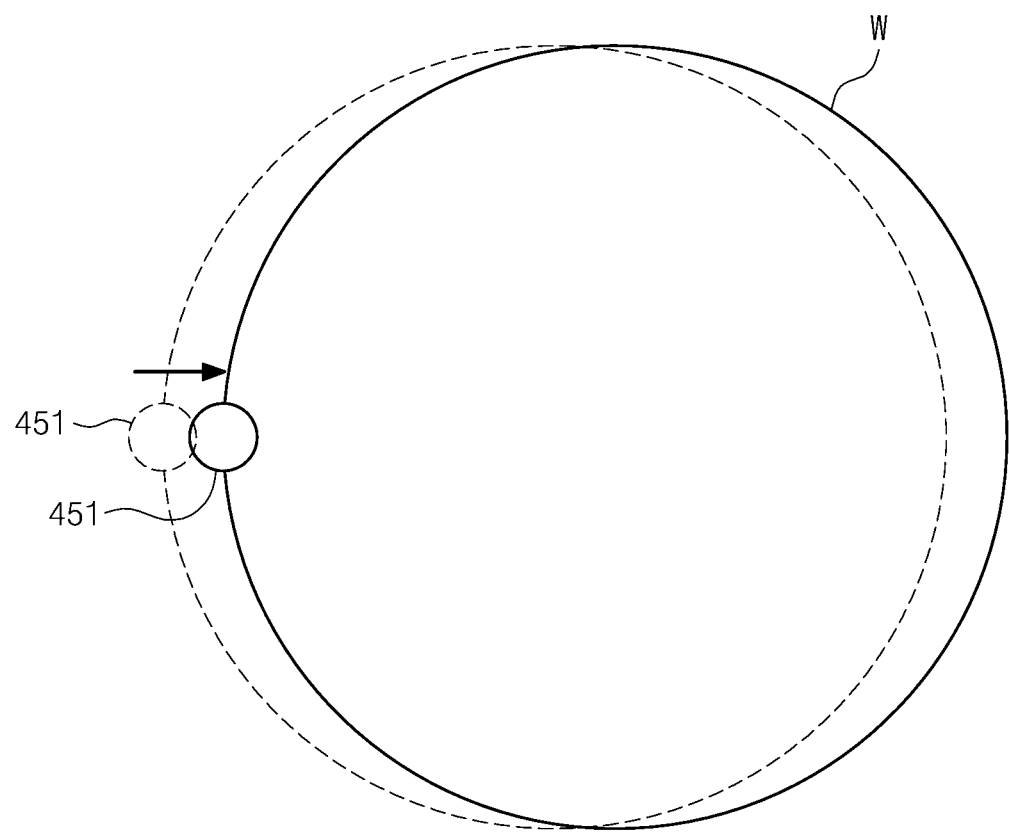

In the case where the substrate W is eccentrically located off the center of the support plate 421, when the support plate 421 is rotated, the distal end of the substrate W is further biased toward the region of the light irradiating member 451 as illustrated in FIGS. 10 and 11, or is further biased to the opposite side as illustrated in FIGS. 12 and 13, with respect to the light irradiation point according to the rotation angle of the support plate 421.

However, because the light irradiating member 451 irradiates light to the substrate W while moving according to the dynamic profile, the width by which the light is irradiated to the entire edge region of the substrate W is the same from the distal end of the substrate W even though the substrate W is eccentrically located off the center of the support plate 421.

In the above-described embodiment, it has been described that the treating liquid is dispensed onto the substrate W before the light is irradiated to the substrate W. However, without being limited thereto, the treating liquid and the light may be simultaneously supplied to the substrate W.

FIGS. 14 to 17 illustrate other embodiments of the edge treating apparatus of the inventive concept.

In the above-described embodiments, it has been exemplified that light heats the treating liquid dispensed. However, as illustrated in FIG. 14 or 15, only one of the liquid dispensing nozzle 441 for dispensing the treating liquid and the light irradiating member 451 for irradiating light may be provided.

Figure 14:
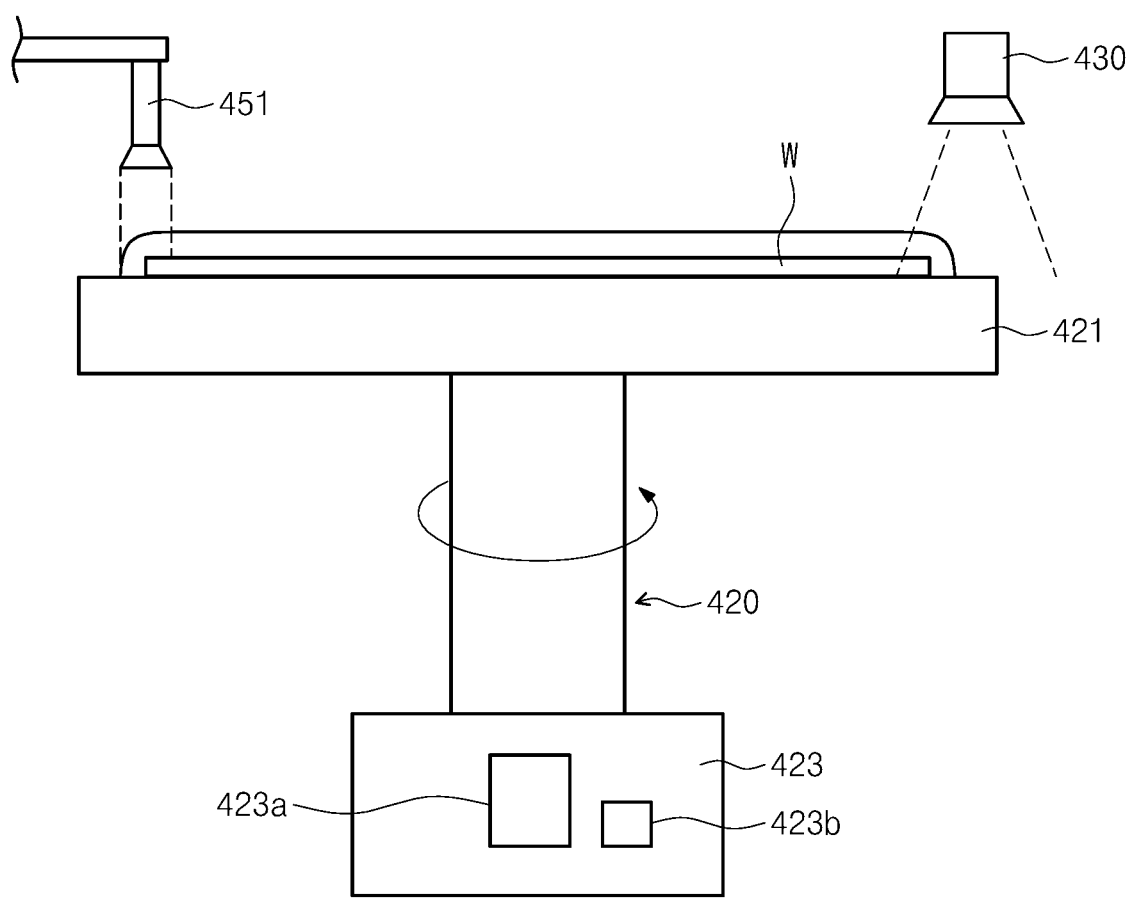
FIGS. 14 to 17 are schematic views illustrating other embodiments of the edge treating chamber of FIG. 4.
Figure 15:
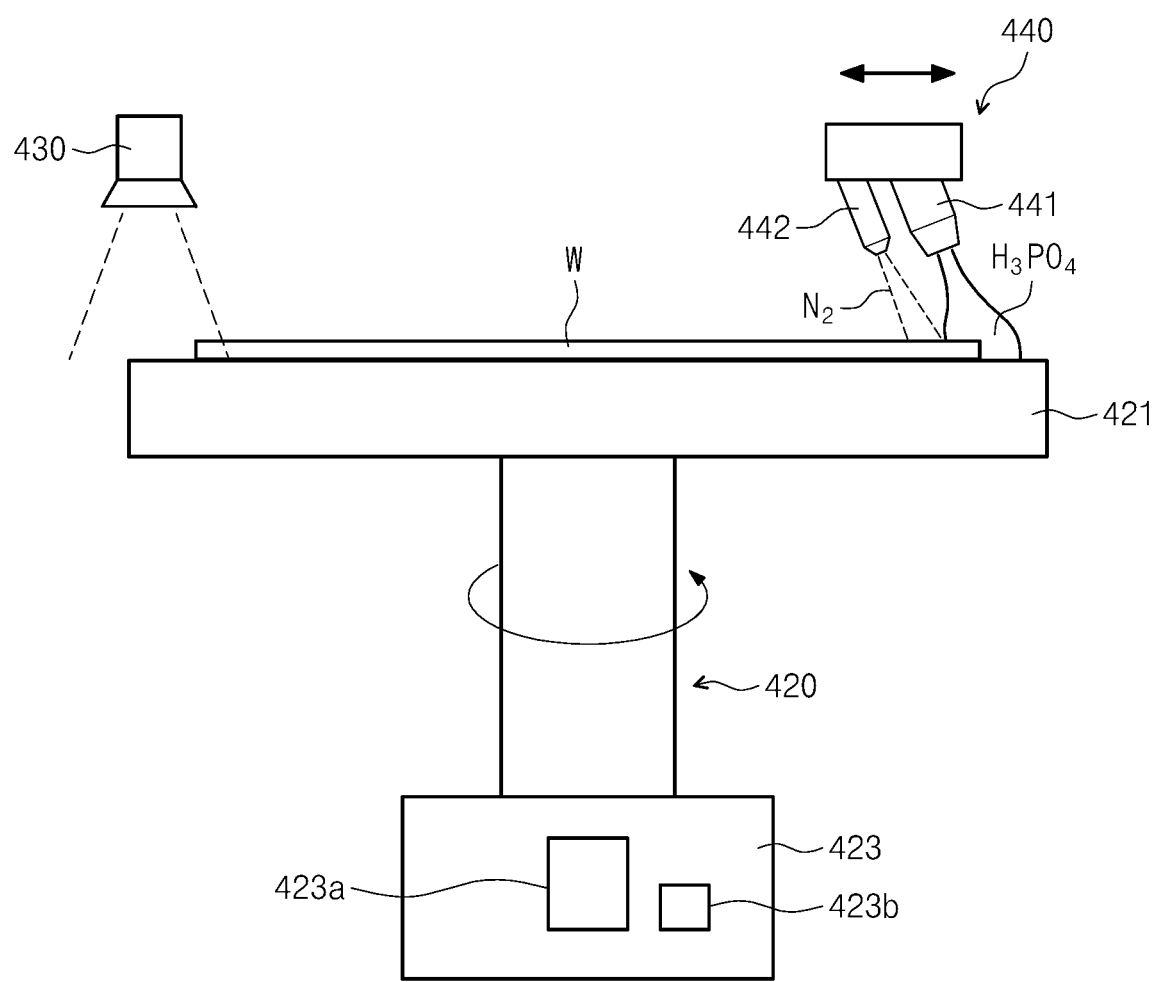

In the case where only the light irradiating member 451 is provided as illustrated in FIG. 14, the film on the edge region of the substrate W is directly removed by light. Furthermore, in the case where only the liquid dispensing nozzle 441 is provided as illustrated in FIG. 15, the liquid dispensing nozzle 441 functions as the edge treating unit 450 described above.

In the above-described embodiments, it has been described that the gas dispensing nozzle 442 is located adjacent to the liquid dispensing nozzle 441 and moves together with the liquid dispensing nozzle 441 to prevent the treating liquid from flowing toward the central region of the substrate W when the treating liquid is dispensed onto the edge region of the substrate W.

Figure 16:
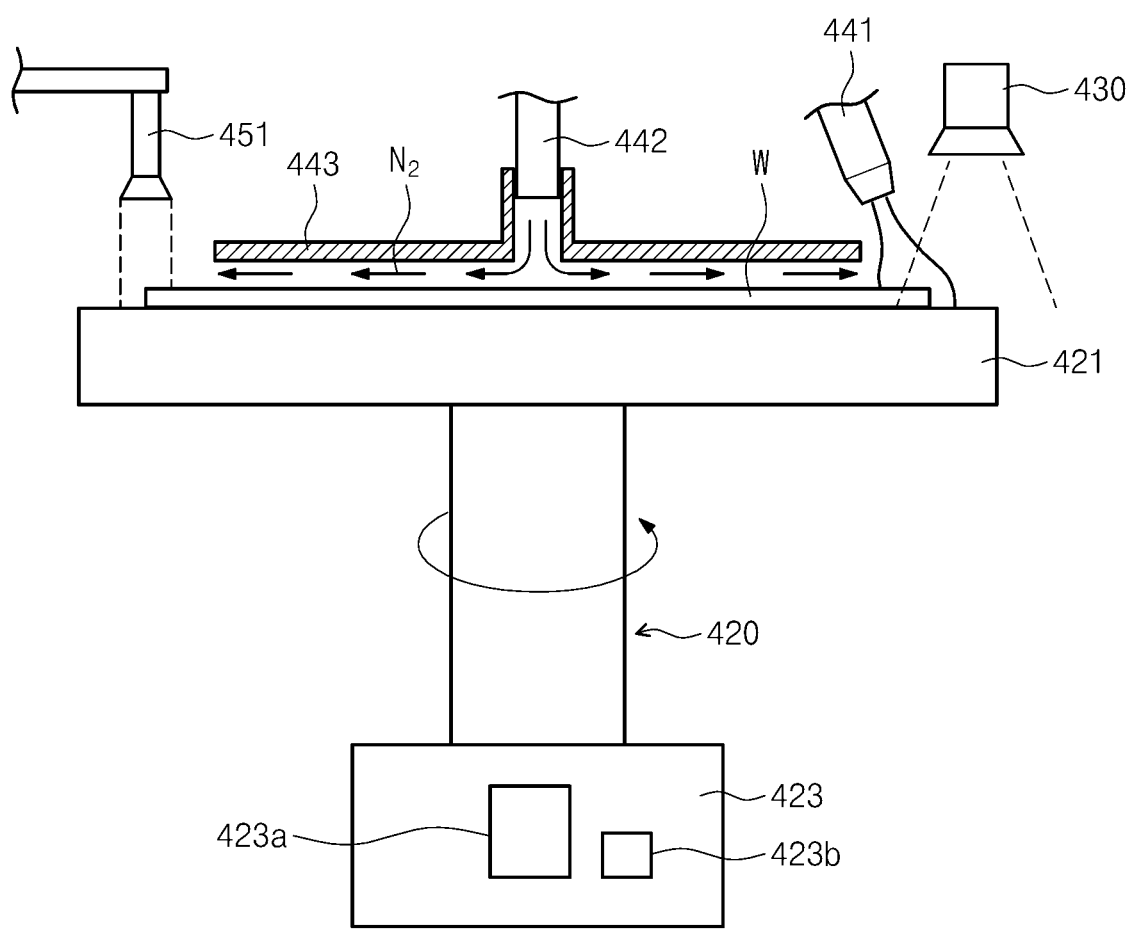

However, as illustrated in FIG. 16, a counter plate 443 may be provided, and a gas may be supplied into the region between the counter plate 443 and the substrate W.

Figure 17:
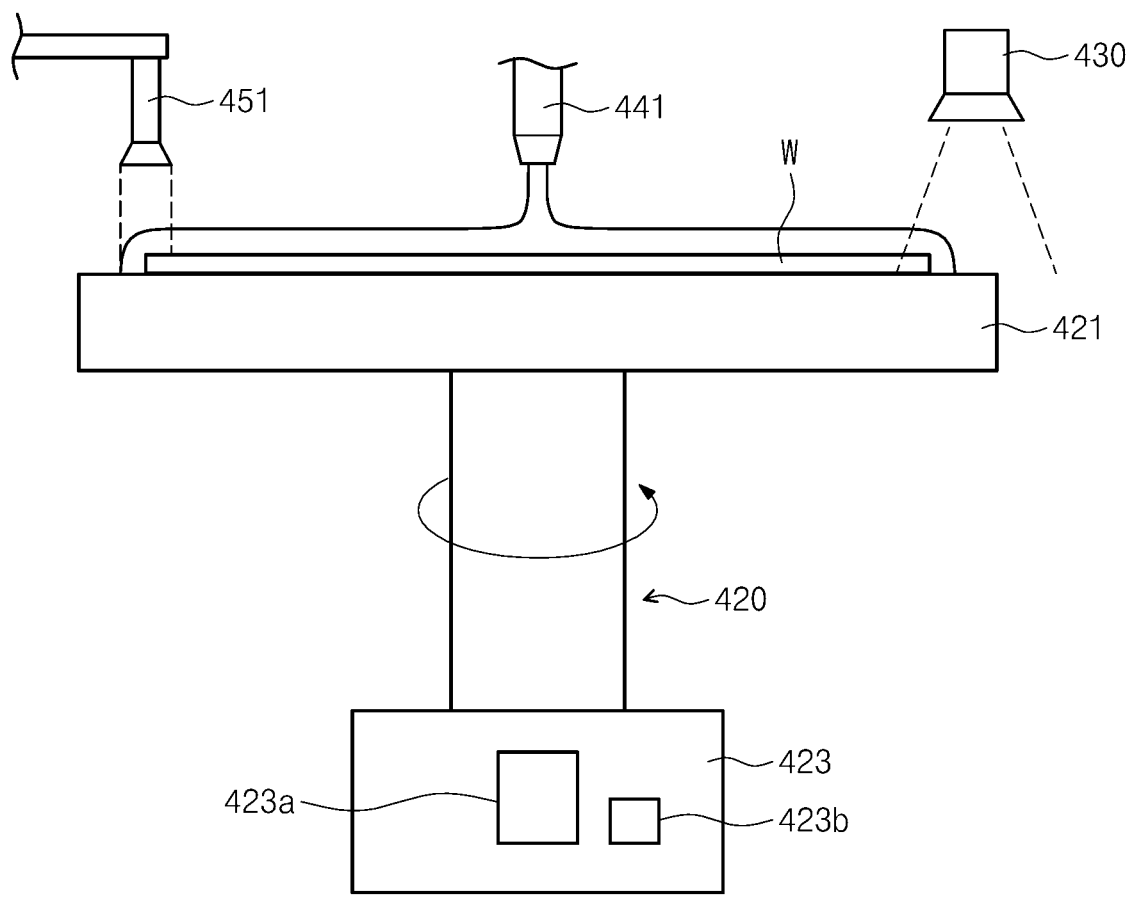

Furthermore, in the above-described embodiments, it has been exemplified that the treating liquid is dispensed onto the edge region of the substrate W. However, as illustrated in FIG. 17, the liquid dispensing nozzle 441 may dispense the treating liquid onto only the central region of the substrate W, or may dispense the treating liquid onto the entire region of the substrate W to treat the substrate W while moving between the central region and the edge region of the substrate W. In this case, the light irradiating member 451 may irradiate light to the edge region of the substrate W to heat the treating liquid on the edge region of the substrate W.

The above-described embodiments of FIGS. 14 to 17 are the same as the embodiment of FIG. 4 in that the photographing member 430 takes images of the substrate W, the dynamic profile of the edge treating unit 450 is generated based on the images, and the edge treating unit 450 treats the substrate W while moving according to the dynamic profile during the rotation of the substrate W.

Although it has been described in the above embodiments that the treating liquid is phosphoric acid and the film being removed is a silicon nitride film, the type of treating liquid and the type of film are not limited thereto.

According to the embodiments of the inventive concept, the apparatus and method may treat an edge region of a rotating substrate to the same width from a distal end of the substrate.

Furthermore, the apparatus and method according to the inventive concept may treat an edge region of a substrate to the same width even though the substrate is offset from a correct position when clamped by vacuum pressure.

In addition, the apparatus and method according to the inventive concept may treat an edge region of a rotating substrate to the same width from a distal end of the substrate even though a rotary shaft is misaligned due to aging of equipment.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a rotatable support plate configured to support the substrate;
   a photographing member configured to obtain an image by photographing the rotating substrate;
   an edge treating unit configured to treat an edge region of the substrate;
   a drive member configured to move the support plate or the edge treating unit to change a relative position between the support plate and the edge treating unit; and
   a controller configured to control the drive member,
   wherein the controller controls the drive member such that the relative position is changed depending on a rotation angle of the substrate, based on the image obtained through the photographing member.

2. The apparatus of claim 1, wherein the edge treating unit is a light irradiating member configured to irradiate light.

3. The apparatus of claim 2, wherein the light irradiating member includes a laser configured to irradiate a laser beam.

4. The apparatus of claim 3, wherein the controller controls the drive member such that, depending on the rotation angle of the substrate placed on the support plate, a light irradiation point is changed along a straight line that connects the center of the substrate placed in a correct position on the support plate when viewed from above and a point where the light is irradiated to the substrate placed in the correct position.

5. The apparatus of claim 4, wherein the photographing member photographs the edge region of the substrate,
   wherein the photographing member photographs the edge region of the substrate a plurality of times to obtain a plurality of images while the support plate is rotated through one revolution, and
   wherein the controller calculates, on the straight line, a distance from the center of the substrate placed in the correct position on the support plate to a distal end of the substrate placed on the support plate, at each rotation angle during the rotation of the support plate by using the plurality of images.

6. The apparatus of claim 5, wherein the rotation angle of the support plate and photographing time of the photographing member are synchronized with each other.

7. The apparatus of claim 1, wherein the controller controls the drive member such that a region where the light is irradiated to the substrate is the same with respect to a distal end of the substrate when the substrate placed on the support plate is rotated.

8. The apparatus of claim 1, wherein the controller:
   calculates an eccentric distance and an eccentric direction of the substrate placed on the support plate from the center of the substrate placed in a correct position, based on the image obtained through the photographing member; and
   controls the drive member such that a region where the light is irradiated to the substrate is the same with respect to a distal end of the substrate, depending on the rotation angle of the substrate from the eccentric distance and direction calculated.

9. The apparatus of claim 8, wherein the controller:
   generates a dynamic profile using positions to which the light irradiating member moves according to the rotation of the substrate; and
   controls the drive member according to the dynamic profile.

10. The apparatus of claim 9, wherein the support plate is rotated by a first motor,
    wherein the drive member includes a second motor configured to move the light irradiating member, and
    wherein the controller performs synchronization control on the first motor and the second motor such that the light irradiating member is moved according to the dynamic profile depending on a rotation angle of the support plate.

11. The apparatus of claim 1, further comprising:
a nozzle unit configured to dispense a treating liquid onto a region where the light is irradiated to the substrate placed on the support plate.

12. The apparatus of claim 11, wherein the controller controls the nozzle unit and the light irradiating member such that the light irradiating member irradiates the light to the treating liquid after the nozzle unit dispenses the treating liquid onto the support plate.

13. The apparatus of claim 11, wherein the support plate is rotated by a first motor, and
wherein the controller changes a dispensing position of the treating liquid such that the dispensing position of the treating liquid dispensed from the nozzle unit is the same from a distal end of the substrate, depending on the rotation angle of the support plate.

14. The apparatus of claim 11, wherein the treating liquid is dispensed onto the edge region of the substrate, and
wherein the apparatus further comprises a spread prevention means configured to prevent the treating liquid dispensed onto the edge region from flowing toward a central region of the substrate.

15. A method for treating a substrate, the method comprising:
treating the substrate by irradiating light from an edge treating unit, or dispensing a treating liquid from a nozzle unit, to an edge region of the substrate placed on a rotating support plate,
wherein the edge treating unit irradiates the light to the substrate while being moved, based on a position where the substrate is offset from a correct position on the support plate, when the substrate is placed on the support plate in a state of being offset from the correct position on the support plate, wherein the edge treating unit includes a light irradiating member configured to irradiate the light, and wherein the light irradiating member moves such that a region where the light is irradiated to the substrate is the same with respect to a distal end of the substrate.

16. The method of claim 15, wherein the light irradiating member is moved such that, depending on a rotation angle of the substrate placed on the support, a light irradiation point is changed along a straight line that connects the center of the substrate placed in the correct position on the support plate when viewed from above and a point where the light is irradiated to the substrate placed in the correct position.

17. The method of claim 15, wherein a photographing member obtains a plurality of images by photographing the edge region of the substrate a plurality of times while the substrate is rotated through one revolution during rotation of the support plate after the substrate is placed on the support plate, an eccentric distance and an eccentric direction of the substrate placed on the support plate are calculated based on the plurality of images, and the light irradiating member is moved based on the eccentric distance and the eccentric direction.

18. The method of claim 17, wherein a dynamic profile of the light irradiating member is generated based on the eccentric distance and the eccentric direction, and the light irradiating member is moved based on the dynamic profile.

19. The method of claim 15, wherein the light is a laser beam.

20. The method of claim 19, wherein a treating liquid is dispensed onto the substrate before or while the light is irradiated, and
wherein the light heats the treating liquid dispensed onto the substrate.

21. The method of claim 20, wherein the treating liquid includes phosphoric acid.

22. The method of claim 19, wherein the light directly removes a film on the substrate.

* * * * *